US 6,714,384 B2

(12) United States Patent
Himes et al.

(10) Patent No.: US 6,714,384 B2
(45) Date of Patent: *Mar. 30, 2004

(54) REDUCED STIFFNESS PRINTED CIRCUIT HEAD INTERCONNECT

(75) Inventors: Adam Karl Himes, Richfield, MN (US); Kevin Jon Schulz, Apple Valley, MN (US)

(73) Assignee: Seagate Technology LLC, Scotts Valley, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/456,746

(22) Filed: Dec. 7, 1999

(65) Prior Publication Data

US 2003/0007292 A1 Jan. 9, 2003

Related U.S. Application Data

(60) Provisional application No. 60/111,300, filed on Dec. 7, 1998.

(51) Int. Cl.[7] .............................. G11B 5/48; G11B 21/16
(52) U.S. Cl. .................................. 360/245.9; 360/244.3
(58) Field of Search ........................... 360/245.9, 245.8, 360/244.3

(56) References Cited

U.S. PATENT DOCUMENTS

| 4,761,699 | A | * | 8/1988 | Ainslie et al. | |
|---|---|---|---|---|---|
| 5,504,640 | A | | 4/1996 | Hagen | |
| 5,809,634 | A | * | 9/1998 | Inaba | |
| 5,844,751 | A | * | 12/1998 | Bennin et al. | |
| 5,854,724 | A | * | 12/1998 | Inaba et al. | |
| 5,862,010 | A | * | 1/1999 | Simmons et al. | |
| 5,873,159 | A | * | 2/1999 | Arya et al. | |
| 6,125,015 | A | * | 9/2000 | Carlson et al. | 360/245.9 |
| 6,134,075 | A | * | 10/2000 | Bennin et al. | |
| 6,201,664 | B1 | * | 3/2001 | Le et al. | 360/245.9 |

* cited by examiner

Primary Examiner—Craig A. Renner
(74) Attorney, Agent, or Firm—Merchant & Gould P.C.

(57) ABSTRACT

A printed circuit head interconnect of a head gimbal assembly (HGA) has different material thicknesses in different regions of the printed circuit head interconnect. The printed circuit head interconnect includes a lamination sheet of materials having dielectric materials and conductive materials. The regions which need to have a lower stiffness are made thinner than the rest of the regions. The rest of the regions are made thick and robust enough to support the HGA. A method of reducing the thicknesses of the printed circuit head interconnect includes applying a resist mask pattern having a plurality of openings with different sizes so as to obtain different thicknesses of the materials in different regions of the printed circuit head interconnect.

19 Claims, 5 Drawing Sheets

REDUCED STIFFNESS PRINTED CIRCUIT HEAD INTERCONNECT

RELATED APPLICATIONS

This application claims the benefit of Provisional Application, U.S. Ser. No. 60/111,300, filed on Dec. 7, 1998, entitled to "REDUCED STIFFNESS PRINTED CIRCUIT HEAD INTERCONNECT", by Adam Karl Himes and Kevin John Schulz.

FIELD OF THE INVENTION

The invention relates generally to magnetic disc drives and head gimbal assemblies, more particularly, to magnetic disc drives and head gimbal assemblies having a printed circuit head interconnect with a different material thickness.

BACKGROUND OF THE INVENTION

Modern computers require media in which digital data can be quickly stored and retrieved. Magnetizable (hard) layers on discs have proven to be a reliable media for fast and accurate data storage and retrieval. Disc drives that read data from and write data to hard discs have thus become popular components of computer systems. To access memory locations on a disc, a read/write head (also referred to as a "slider") is positioned slightly above the surface of the disc while the disc rotates beneath the read/write head at an essentially constant velocity. By moving the read/write head radially over the rotating disc, all memory locations on the disc can be accessed. The read/write head is typically referred to as "flying" head because it includes a slider aerodynamically configured to hover above the surface on an air bearing located between the disc and the slider that is formed as the disc rotates at high speeds. The air bearing supports the read/write head above the disc surface at a height referred to as the "flying height."

In conventional disc drives, one or more hard discs are coupled to and rotate about a spindle, each disc presenting two opposite substantially flat surfaces for reading and recording. Typically, multiple rotating hard discs are stacked in a parallel relationship with minimal spacing between adjacent discs. Accordingly, the read/write heads must be designed to move within the narrow space between adjacent discs and fly close to the disc surfaces. To achieve this positional capability, the read/write heads in typical disc drives are coupled to the distal end of thin, arm-like structures called head gimbal assemblies, or HGAs. The HGAs are inserted within the narrow space between adjacent discs. The HGAs are made of materials and thicknesses as to be somewhat flexible and allow a measure of vertical positioning as the read/write heads hover over the surface of the rotating discs.

Each HGA is coupled at its proximal end to a rigid actuator arm. The actuator arm horizontally positions the HGA and read/write head over the disc surface. In conventional disc drives, actuator arms are stacked, forming a multi-arm head stack assembly. The head stack assembly moves as a unit under the influence of a voice coil motor to simultaneously position all head gimbal assemblies and corresponding read/write heads over the disc surfaces.

The HGA in a typical disc drive includes four components: 1) a read/write head or slider, features a self-acting hydrodynamic air bearing and an electromagnetic transducer for recording and retrieving information on a spinning magnetic disc; 2) a gimbal, which is attached to the slider, is compliant in the slider's pitch and roll axes for the slider to follow the topography of the disc, and is rigid in yaw and in-plane axes for maintaining precise slider positioning; 3) a load beam or flexure, which is attached to the gimbal and to the actuator arm which attaches the entire HGA to the actuator. The load beam is compliant in a vertical axis to allow the slider to follow the topography of a disc, and is rigid in the in-plane axes for precise slider positioning. The load beam also supplies a downward force that counteracts the hydrodynamic lifting force developed by the slider's air bearing; and 4) a printed circuit head interconnect, which is disposed on the load beam and electrically coupled to the transducer of the slider. The printed circuit head interconnect sends the electric signals to and from the transducer of the slider.

The gimbal of the HGA traditionally includes a stainless steel member of substantially less thickness than the load beam of the HGA. The geometry of the gimbal allows an easy movement out of the plane of a disc but restricts an in-plane movement. Since the gimbal and the head interconnect are both attached to the slider, the head interconnect as well as the gimbal influence the mechanical characteristics, for example, fly height, etc., of the slider during a read/write operation.

One of the challenges facing a designer of a printed circuit head interconnect of an HGA is to minimize torque bias imparted to the slider due to a read/write operation. Torque affects a fly height, which in turn affects the ability of a transducer to read/write digital data from/to a disc. Generally, torque is the product of angular displacement and torsional stiffness. Torque is typically described as having a pitch direction and a roll direction. In a pitch direction, the slider rotates about an axis (referred to as a pitch axis) transverse to a longitudinal axis of a slider suspension and parallel to the surface plane of the disc. In a roll direction, the slider rotates about an axis (referred to as a roll axis) parallel to the longitudinal axis of the slider suspension.

One of the problems of an HGA is a fly height variation during an operation. The fly height variation may cause variation in electromagnetic signals used for reading/writing data from/to a disc. In addition, an excessive fly height variation, particularly when fly heights are relatively small, may raise reliability issues related to wear of a head-disc interface. Accordingly, a lower fly height variation is needed. Reduced HGA stiffness has proven to be a solution to such problem. One way of reducing HGA stiffness could be to reduce the material thickness of the printed circuit head interconnect. However, reducing the material thickness of the printed circuit head interconnect makes the printed circuit head interconnect fragile and difficult to handle, resulting in decreased yields and increased part costs. For a typical HGA, conductive materials on the printed circuit head interconnect are required to be large enough that their stiffness is considerable compared to the gimbal of the HGA. Further, not only is the stiffness due to the printed circuit head interconnect undesirable, but also the material properties of the printed circuit head interconnect are not predictable because the material properties vary with respect to temperature. This makes design decisions difficult. Furthermore, the different coefficients of thermal and hygroscopic expansion between the gimbal and head interconnect materials result in differential expansion causing changes in an angular displacement when the HGA is exposed to changes in heat and humidity.

It is, therefore, desirable to make the stiffness contribution due to the printed circuit head interconnect be as small as possible.

It is with respect to these and other considerations that the present invention has been made.

SUMMARY OF THE INVENTION

In accordance with this invention, the above and other problems were solved by providing a printed circuit head interconnect of a head gimbal assembly (HGA) having different material thicknesses in appropriate regions of the printed circuit head interconnect. The regions which need to have a lower stiffness are made thinner than the rest of the regions. The rest of the regions are made thick and robust enough to support the HGA.

In one embodiment of the present invention, a printed circuit head interconnect for electrically coupling to a magnetic head of a disc drive includes a lamination sheet of materials having dielectric materials and conductive materials. A thickness of the lamination sheet of materials is different in different regions of the printed circuit head interconnect.

Still in one embodiment, a thickness of the dielectric materials is different in different regions of the printed circuit head interconnect. Alternatively, a thickness of the conductive materials is different in different regions of the printed circuit head interconnect.

Further in one embodiment, a first region is thinner than a second region. The first region is formed by etching the materials by use of a resist mask pattern. The resist mask pattern includes an opening small enough such that etchants etch the materials in a vertical direction and in a horizontal direction at a comparable rate.

Additionally in one embodiment, the resist mask pattern includes a plurality of openings with different sizes to obtain different thicknesses of the materials.

In one embodiment of the present invention, an HGA or supporting a magnetic head in a disc drive includes an elongated flexure, a gimbal coupling the magnetic head to the flexure, and a printed circuit head interconnect for electrically coupling to the magnetic head. The printed circuit head interconnect is disposed on the elongated flexure and electrically coupled to the magnetic head. The printed circuit head interconnect includes a lamination sheet of materials having dielectric materials and conductive materials. A thickness of the lamination sheet of materials is different in different regions of the printed circuit head interconnect.

Further in one embodiment, the gimbal is mounted on the magnetic head at a first end and mounted on the flexure at a second end.

Still in one embodiment, a thickness of the dielectric materials is different in different regions of the printed circuit head interconnect. Alternatively, a thickness of the conductive materials is different in different regions of the printed circuit head interconnect.

Additionally in one embodiment, a first region is thinner than a second region. The first region is formed by etching the materials by use of a resist mask pattern. The resist mask pattern includes an opening small enough such that etchants etch the materials in a vertical direction and in a horizontal direction at a comparable rate.

Still in one embodiment, the resist mask pattern includes a plurality of openings with different sizes to obtain different thicknesses of the materials.

In one embodiment of the present invention, a method is provided to reduce a thickness of a printed circuit head interconnect for electrically coupling to a magnetic head of a disc drive. First, a first resist mask pattern is applied onto a first material. The first resist mask pattern has a first plurality of openings with different sizes. Then, the first material is etched. After etching, the first resist mask pattern is removed. Accordingly, the etched first material has different thicknesses in different regions.

Further in one embodiment, the first plurality of openings of the first resist mask pattern are small enough such that etchants etch the first material in a vertical direction and in a horizontal direction at a comparable rate.

Additionally in one embodiment, a second resist mask pattern is applied onto a second material at the same time as applying the first resist mask pattern. The second resist mask pattern has a second plurality of openings with different sizes. Then the second material is etched at the same time as etching the first material. After etching, the second resist mask pattern is removed at the same time as removing the first resist mask pattern. Accordingly, the etched second material has different thicknesses in different regions.

These and various other features as well as advantages which characterize the present invention will be apparent from a reading of the following detailed description and a review of the associated drawings.

DETAILED DESCRIPTION OF THE PREFERRED EMBODIMENT

In the following description of the present invention, reference is made to the accompanying drawings which form a part hereof, and in which is shown by way of illustration specific embodiments in which the invention may be practiced. It is understood that other embodiments may be utilized and structural changes may be made without departing from the scope of the present invention.

Figure 1:
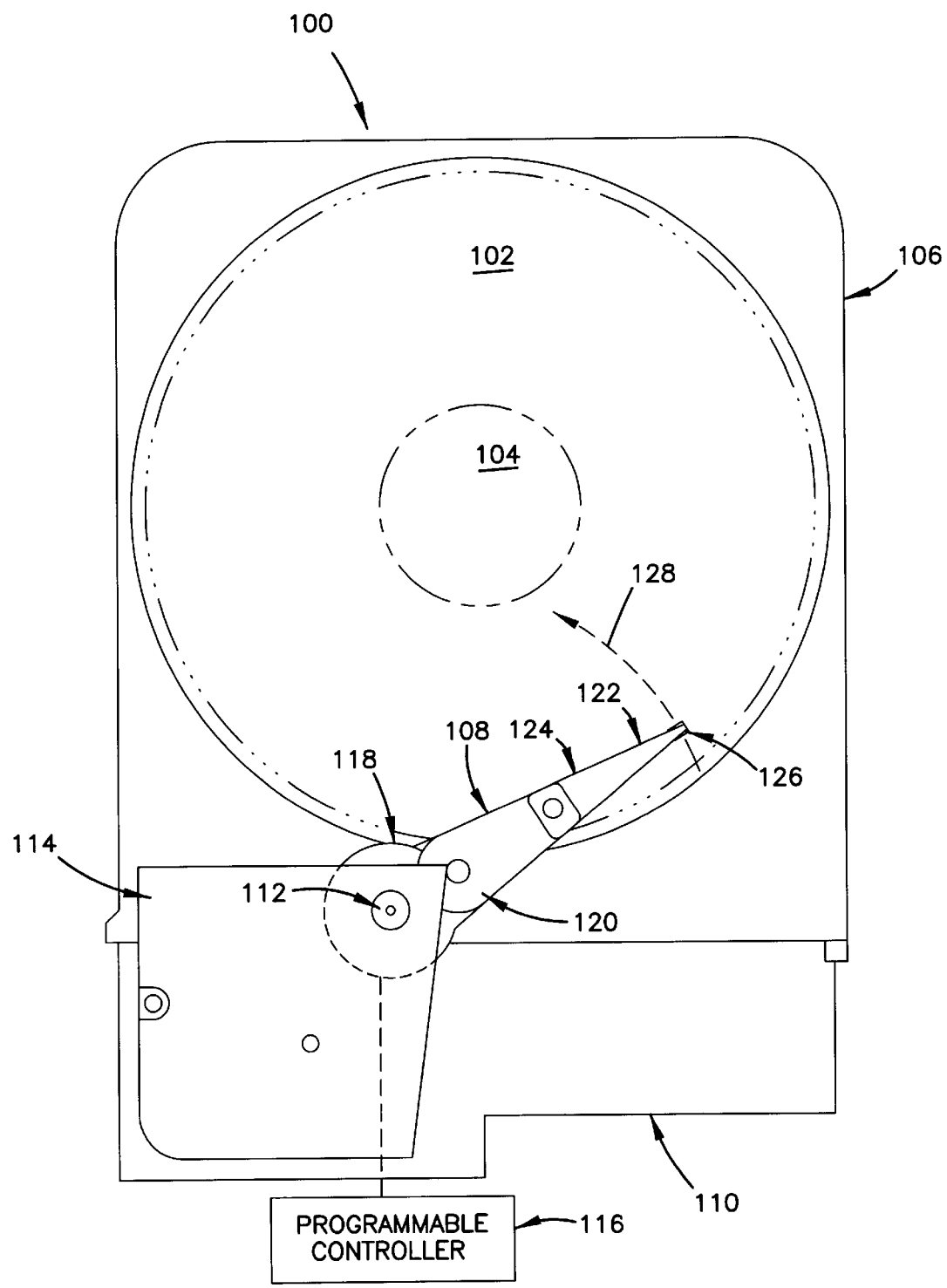
FIG. 1 illustrates a top view of one embodiment of a disc drive in accordance with the principles of the present invention.

FIG. 1 illustrates a top view of one embodiment of a disc drive 100. The disc drive 100 includes a magnetic disc 102 mounted for rotational movement about an axis defined by a spindle 104 within a housing 106. The disc drive 100 also includes a stacked actuator system alternatively referred to as a head stack assembly 108 mounted to a base plate 110 of the housing 106 and pivotally movable relative to the disc 102 about an axis 112. A cover 114 covers a portion of the head stack assembly 108. A drive controller 116 is coupled to the head stack assembly 108. As shown, the drive controller 116 is disposed outside the disc drive 100. It is appreciated that the drive controller 116 can be mounted within the disc drive 100 with a suitable connection to the head stack assembly 108. It is noted that one disc 102 is illustrated in FIG. 1. It is appreciated that a stack of discs are disposed underneath the one disc 102 and mounted for rotational movement about the axis defined by the spindle 104.

The head stack assembly 108 includes an actuator arm assembly 118, an actuator arm 120, and a head gimbal assembly (HGA) 122. The HGA 122 includes a load beam or flexure 124 mounted on the actuator arm 120, and a slider 126 mounted on the load beam 124 via a gimbal 142 shown in FIG. 3. A transducer 130 shown in FIGS. 2 and 3 is disposed at the front end of the slider 126 for reading data from the disc 102 and writing data onto the disc 102.

During operation, the drive controller 116 receives position information indicating a portion of the disc 102 to be accessed. The drive controller 116 may receive the position information from the operator, from a host computer, or from another suitable controller. Based on the position information, the drive controller 116 provides a position signal to the head stack assembly 108. The position signal causes the head stack assembly 108 to pivot or rotate about the axis 112. This, in turn, causes the slider 126 to move radially over the surface of the disc 102 in a generally arcuate path as indicated by arrow 128 shown in FIG. 1. Once the slider 126 is properly positioned, the drive controller 116 then executes a desired read or write operation. After the operation, the drive controller 116 then moves the head stack assembly 108 to an area, e.g. a parking area, etc. It is appreciated that different implementations can be used for the head stack assembly 108 during its non-use period. For example, the head stack assembly 108 can be moved to its original position prior to its movement to the operational position, or can be placed at the same position as the operational position.

Figure 2:
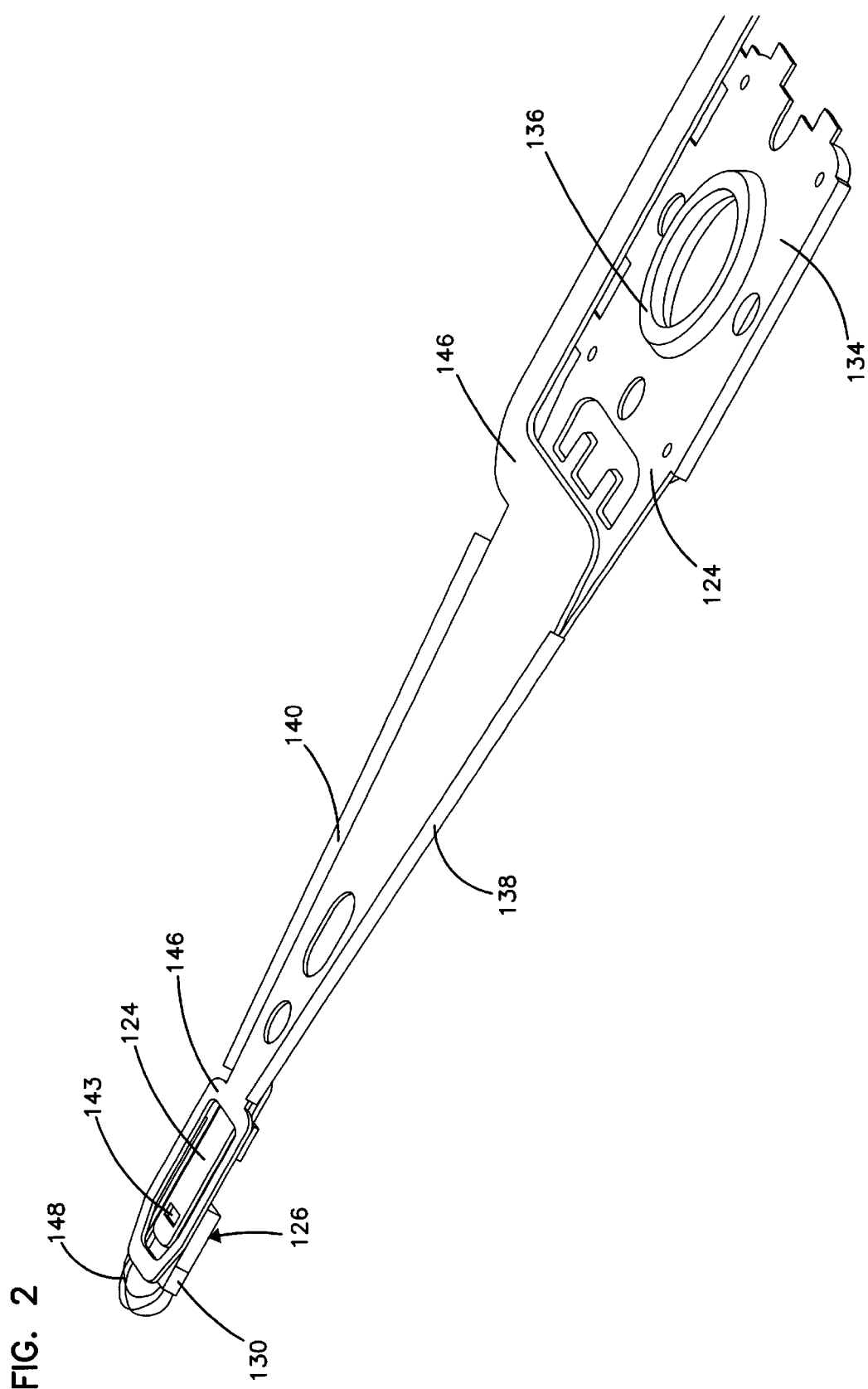
FIG. 2 illustrates a perspective view of one embodiment of a head gimbal assembly (HGA) mountable on an actuator arm of a disc drive in accordance with the principles of the present invention.
Figure 3:
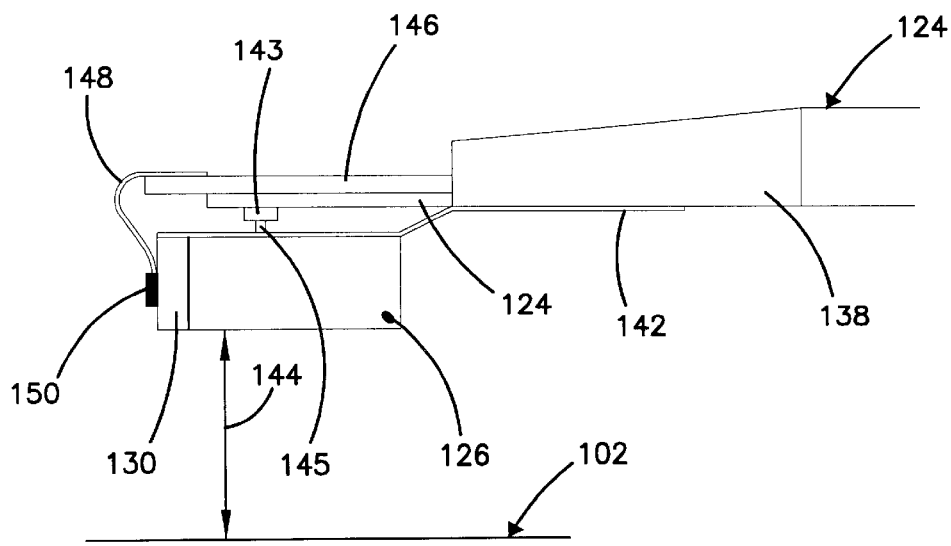
FIG. 3 illustrates an enlarged side view of a distal end of one embodiment of the HGA in accordance with the principles of the present invention.

FIG. 2 is a perspective view of the preferred embodiment of the head gimbal assembly (HGA) 122 in accordance with the principles of the present invention. The HGA 122 includes the load beam 124 having a base plate 134 at a proximal end. The base plate 134 includes a swaging boss 136 for connection of the HGA 122 to the actuator arm 120 shown in FIG. 1. The load beam 124 extends longitudinally from the actuator arm 120 at the proximal end to the slider at a distal end. The load beam 124 is generally configured in a tapered shape from the proximal end to the distal end. The load beam 124 may include bent regions 138,140 at its side edges. At each side edge, the load beam 124 is bent to be substantially perpendicular to the rest of the load beam 124. The bent regions 138,140 provide additional stiffness for the load beam 124 to support the slider 126.

Also shown in FIG. 2, the HGA 122 includes a printed circuit head interconnect 146, often referred to as a "flex circuit." The printed circuit head interconnect 146 is electrically connected to the drive controller 116 at one end and electrically connected to the transducer 130 of the slider 126 via electrical leads 148, such as copper leads, etc. Read/write data are thus transferred between the transducer 130 and the drive controller 116 via the printed circuit head interconnect 146. This type of printed circuit head interconnect 146 is often referred to as a flex-on suspension (FOS) or circuitized suspension. The term, a flex-on suspension (FOS) or circuitized suspension, is used to distinguish the circuit type of HGA from a traditional wire type of HGA. Also, as shown, the printed circuit head interconnect 146 is disposed along the load beam 124 and is configured to mount onto the load beam 124, preferably by an adhesive material, such as glue.

FIG. 3 illustrates an enlarged side view of the distal end of one embodiment of the HGA 122. The HGA 122 includes a gimbal 142. The slider 126 is loaded onto the load beam 124 via the gimbal 142. The slider 126 is mounted at a first end of the gimbal 142. The second end of the gimbal 142 is mounted onto the load beam 124. The gimbal 142 can be glued to the top of the slider 126 at the first end and welded to the bottom of the load beam 124 at the second end. It is appreciated that other types of mounting means can be used between the gimbal 142 and the slider 126 and between the gimbal 142 and the load beam 124.

Figure 4:
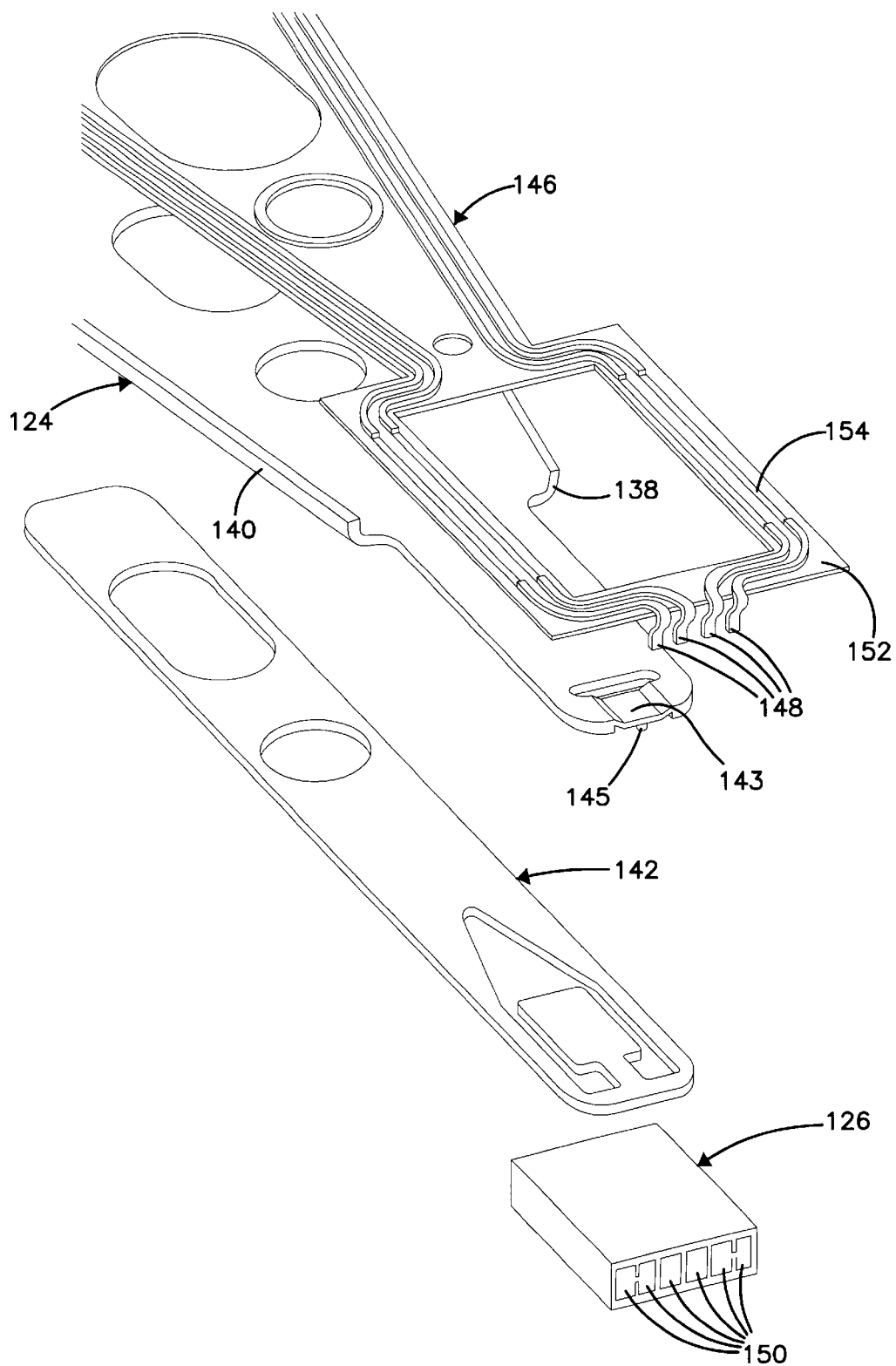
FIG. 4 illustrates an enlarged, exploded perspective view of the distal end of one embodiment of the HGA in accordance with the principles of the present invention.

Also shown in FIG. 3, the load beam 124 includes a depression portion 143 having a dimple 145 extending toward the slider 126 (see also in FIG. 4). The depression portion 143 provides a downward force that counteracts the hydrodynamic lifting force developed by the slider's air bearing during a read/write operation. The dimple 145 provides a pivot point for the slider 126. The gimbal 142 is compliant in the slider's pitch and roll axes for the slider 126 to follow the topography of the disc 102, and is rigid in yaw and in-plane axes for maintaining precise slider positioning. The gimbal 142 is preferably a stainless steel member with substantially less thickness than the load beam 124. During operation, the gimbal 142 allows the slider 126 to hover over the surface on an air bearing located between the disc 102 and the slider 126 that is formed as the disc 102 rotates at high speeds. The air bearing supports the slider 126 above the disc 102 surface at a height 144, often referred to as the "flying height".

FIG. 4 illustrates an enlarged, exploded perspective view of the distal end of one embodiment of the HGA 122 including the printed circuit head interconnect 146, the load beam 124, the gimbal 142, and the slider 126. The printed circuit head interconnect 146 is electrically connected to the slider 126 via the leads 148. At one end, the leads 148 extend out of the conductive materials, such as copper, of the printed circuit head interconnect 146. At the other end, the leads 148 are electrically coupled to bonding pads 150 of the slider 126. The bonding pads 150 are electrically coupled to a circuitry (not shown) of the transducer 130.

In FIG. 4, the printed circuit head interconnect 146 is preferably made of dielectric materials 152, such as polyimide, and conductive materials 154, such as copper. The conductive materials 154 are patterned on the dielectric materials 152. The dielectric materials 152 and the conductive materials 154 are laminated by a cover dielectric material (not shown) to prevent wear and tear and provide electrical insulation for the conductive materials 154.

Figure 5:
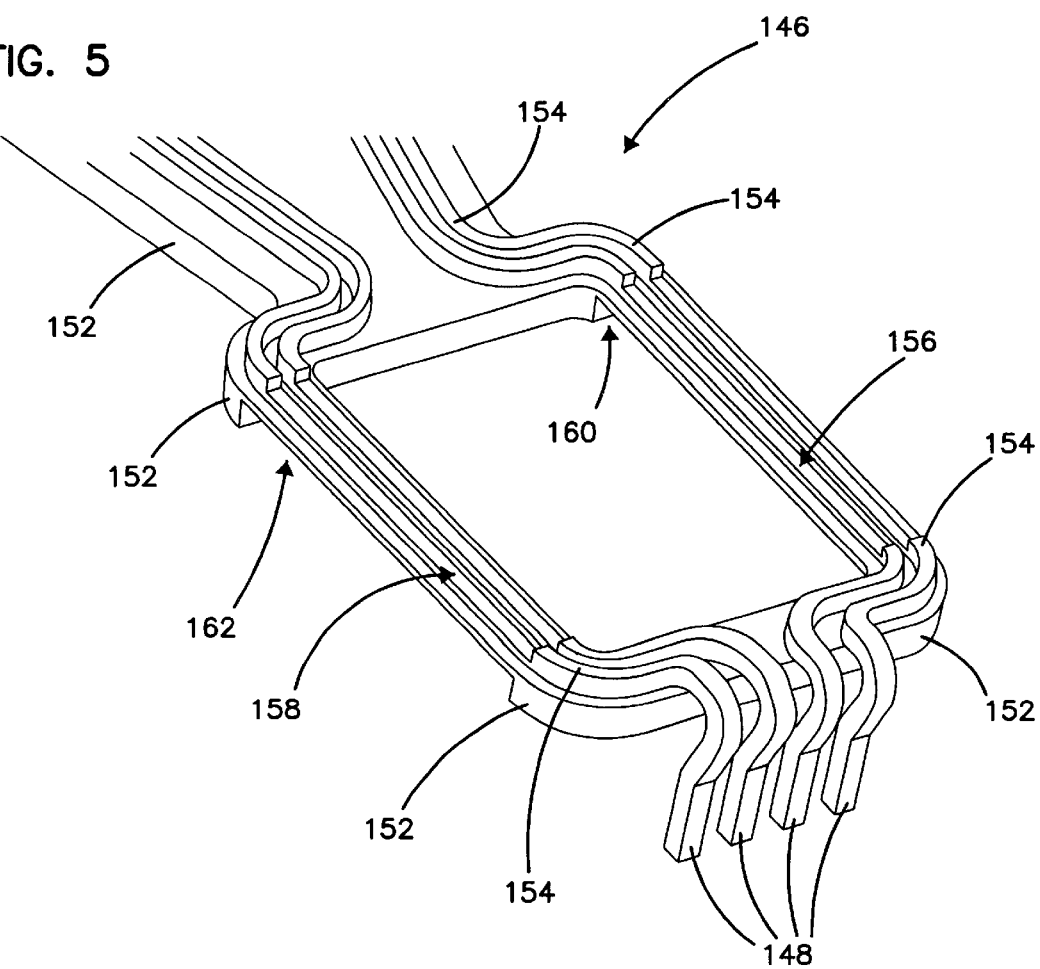
FIG. 5 illustrates a further enlarged perspective view of a printed circuit head interconnect of one embodiment of the HGA in accordance with the principles of the present invention.

In FIG. 5, a further enlarged perspective view of one embodiment of the printed circuit head interconnect 146 in accordance with the principles of the present invention is shown. The thickness of the conductive materials 154 is reduced at regions 156,158 of the printed circuit head interconnect 146. The thickness of the dielectric materials 152 is also reduced at regions 160,162 of the printed circuit head interconnect 164. In general, one of the greatest contributors to torsional stiffness of an HGA is the thickness of the materials of the HGA. On the other hand, one of the greatest contributors to sustain the damage to the HGA is also the thickness of the materials of the HGA. As a result, the regions 156, 158, 160, and 162 are those regions which need to have low stiffness. The remaining regions of the printed circuit head interconnect 146 are thicker so as to sustain the damage to the HGA. A finite element model known to a person skilled in the art can be used to evaluate the benefit of reduced material thicknesses for selecting the appropriate regions of less thickness. It will be appreciated to a person skilled in the art that other models may be used to determine which regions the thickness of the materials should be reduced. The following table summarizes simulated HGA stiffnesses (without the contribution of the gimbal stiffness) by a finite element model in one embodiment of the present invention:

| Dielectric/Conductive material thickness (microns) | Pitch stiffness (uNm/deg) | Roll Stiffness (uNm/deg) |
| --- | --- | --- |
| 50/15 | 1.1 | 1.0 |
| 50/7.5 | .9 | .8 |
| 25/15 | .5 | .3 |
| 25/7.5 | .4 | .2 |

Note: uNm/deg stands for micro-Newton-meters/degree.

A typical thickness of the dielectric materials without reduction is 50 microns, and a typical thickness of the conductive materials without reduction is 15 microns. In the preferred embodiment, the thickness of the dielectric materials is approximately 25 microns, and the thickness of the conductive materials is approximately 7.5 microns.

In the fabrication of the printed circuit head interconnect 146, a single process can be used to obtain different thicknesses of the dielectric materials and conductive materials. Instead of using traditional processes of etching, plating and/or combination of etching and plating processes, a single process is used to reduce the different thicknesses of the printed circuit head interconnect 146. In the preferred embodiment, a photoresist mask pattern is placed on the dielectric materials and the conductive materials. The photoresist mask pattern has a plurality of mask openings. The mask openings are configured such that the mask openings are small enough, and the etching process in a vertical direction proceeds at a slower rate. On the other hand, the etchants also etch the sidewalls of the materials in a horizontal direction, and the etching process on the sidewalls proceeds at a comparable rate as the etching process in the vertical direction. Such insufficient etchant circulation and the natural etching sidewall techniques are used to create areas of reduced dielectric thickness and conductive thickness.

Figure 6:
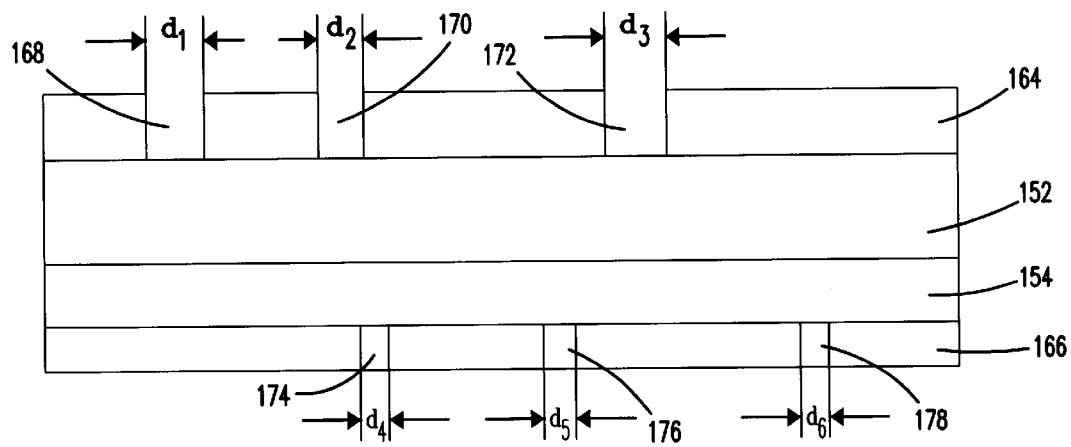
FIG. 6 illustrates a cross-sectional view of one embodiment of a printed circuit head interconnect before etching, to reduce the thickness of the printed circuit head interconnect in accordance with the principles of the present invention.
Figure 7:
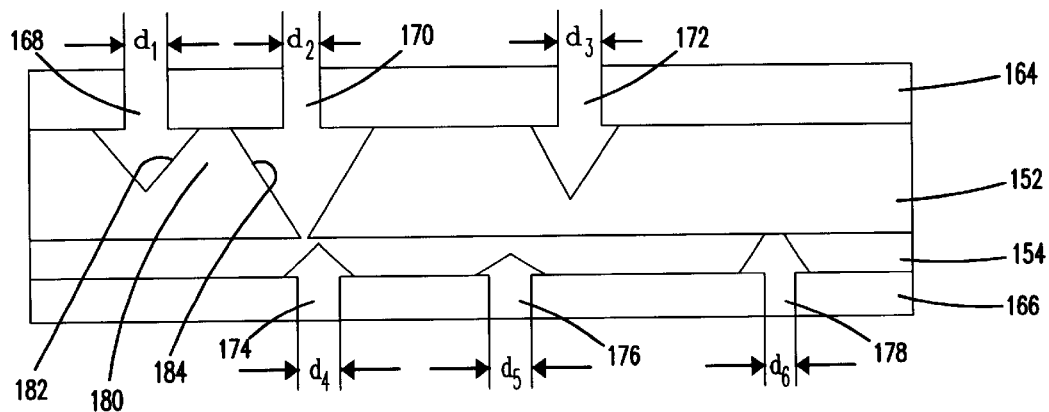
FIG. 7 illustrates a cross-sectional view of one embodiment of a printed circuit head interconnect after etching, to reduce the thickness of the printed circuit head interconnect in accordance with the principles of the present invention.
Figure 8:
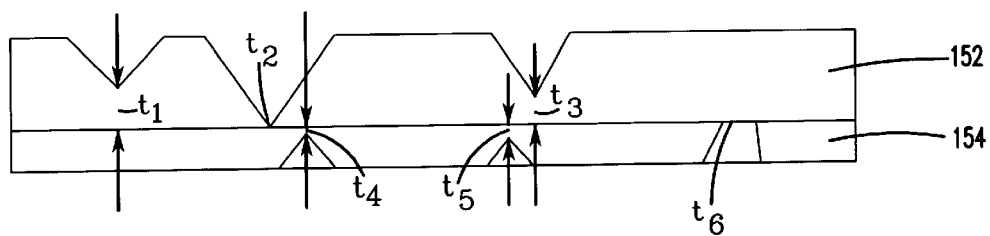
FIG. 8 illustrates a cross-sectional view of one embodiment of a printed circuit head interconnect after removing a resist mask pattern shown in FIGS. 6 and 7 in accordance with the principles of the present invention.

FIGS. 6–8 illustrate a single process of obtaining different thicknesses t1, t2, t3 of the dielectric materials 152 and different thicknesses t4, t5, t6 of the conductive materials 154. A photoresist mask pattern 164 is placed on the dielectric materials 152, and a photoresist mask pattern 166 is placed on the conductive materials 154. Mask openings 168, 170, and 172 of the photoresist mask pattern 164 have different sizes d1, d2, and d3, respectively. Mask openings 174, 176, and 178 of the photoresist mask pattern 166 have different sizes d4, d5, and d6, respectively. Also, the mask openings 168, 170, 172 and 174, 176, 178 are small enough such that the etching process in a horizontal direction, i.e. vertical to the sidewalls, proceeds at a comparable rate as the etching process in a vertical direction, i.e. parallel to the sidewalls. The sizes of the openings in comparison are shown in FIGS. 6 and 7: d1>d3>d2; d5>d4>d6. The thicknesses of the reduced materials after etching are shown in FIG. 8: t1>t3>t2; t5>t4>t6. As shown, different thicknesses of materials are obtained in a single process. It is appreciated that the sizes of the mask openings can be predetermined for different thicknesses of the materials at the selected regions. It is also appreciated that the openings, for example, 168 and 170, can be made close enough to reduce the thickness of the materials 180 between the sidewalls 182 and 184.

It will be appreciated that the present invention can also be used in other types of circuitized suspension assembly, such as TSA (Trace Suspension Assembly) or CIS (Circuit Integrated Suspension), wherein the gimbal is integrated into the lamination of the printed circuit head interconnect. It will be appreciated that in case of such an assembly, the thickness of the gimbal may also be reduced to lessen the stiffness without departing from the principles of the present invention.

The following table summarizes measured HGA stiffnesses (with the contribution of the gimbal stiffness) in one embodiment of the present invention:

| micro-Newton-meters/degree | Pitch | Roll |
| --- | --- | --- |
| Reduced thickness | 2.48 | 2.51 |
| Traditional thickness | 2.85 | 2.58 |

Accordingly, the reduced thickness HGA shows about a 13% improvement in pitch stiffness, and about a 3% improvement in roll stiffness. As a result, the present invention significantly reduces the fly height variation and improves stability of the HGA.

It is appreciated that low stiffness can also be achieved by optimizing in-plane circuit geometry. The present invention can be coupled with such optimization for even more benefits.

It is also noted that technical terms used above, such as the printed circuit head interconnect, gimbal etc., are terms used in disc drive industry. It is appreciated that other terminology, such as an electrical circuit head interconnect, may be used to within the scope of the present invention.

It is to be understood that even though numerous characteristics and advantages of various embodiments of the present invention have been set forth in the foregoing description, together with details of the structure and function of various embodiments of the invention. This disclosure is illustrative only, and changes may be made in detail within the principles of the present invention to the full extent indicated by the broad general meaning of the terms in which the appended claims are expressed.

What is claimed is:

1. An electrical circuit head interconnect for electrically coupling to a magnetic head of a disc drive, the interconnect comprising:

a dielectric layer; and a conductive layer disposed on the dielectric layer, the conductive layer forming a plurality of traces on the dielectric layer, the plurality of traces having a first thickness and a second thickness wherein the second thickness is less than the first thickness and the second thickness extends in a region located between the first thickness of the conductive layer; and wherein the dielectric layer has a first thickness and a second thickness, the second thickness being less than the first thickness wherein the second thickness of the dielectric layer coincides with the second thickness of the conductive layer.

2. The interconnect of claim 1 wherein the first thickness of the dielectric layer is about 50 microns and the second thickness of the dielectric layer is about 25 microns.

3. The interconnect of claim 1 wherein the first thickness of the conductive layer is about 15 microns and the second thickness of the conductive layer is about 7.5 microns and the first thickness of the dielectric layer is about 50 microns and the second thickness of the dielectric layer is about 25 microns.

4. The interconnect of claim 1 wherein the dielectric and conductive layers form a section that is rectangular in shape wherein the section has a length and a width wherein the second thickness of the dielectric and conductive layers extend along a portion of the length of the section.

5. The interconnect of claim 4 wherein the second thickness of the dielectric and conductive layers extend along substantially the entire length of the section.

6. The electrical circuit head interconnect of claim 1, wherein the interconnect includes first and second regions of reduced thickness, and the first region is formed by etching the layers of the interconnect by use of a resist mask pattern.

7. The electrical circuit head interconnect of claim 6, wherein the resist mask pattern includes an opening small enough such that etchants etch the layers of the interconnect in a vertical direction and in a horizontal direction at a comparable rate.

8. The electrical circuit head interconnect of claim 7, wherein the resist mask pattern includes a plurality of openings with different sizes to obtain different thicknesses of the interconnect layers.

9. The interconnect of claim 1 wherein the first thickness of the conductive layer is about 15 microns and the second thickness of the conductive layer is about 7.5 microns.

10. A head gimbal assembly for supporting a magnetic head in a disc drive, the assembly comprising:
    an elongated flexure;
    a gimbal coupling the magnetic head to the flexure; and
    an electric circuit head interconnect for electrically coupling to the magnetic head of the disc drive, the interconnect comprising:
    a dielectric layer;
    a conductive layer disposed on the dielectric layer, the conductive layer forming a plurality of traces on the dielectric layer, the plurality of traces having a first thickness and a second thickness wherein the second thickness is less than the first thickness and the second thickness extends in a region located between the first thickness of the conductive layer; and
    wherein the dielectric layer has a first thickness and a second thickness, the second thickness being less than the first thickness wherein the second thickness of the dielectric layer coincides with the second thickness of the conductive layer.

11. The interconnect of claim 10 wherein the first thickness of the dielectric layer is about 50 microns and the second thickness of the dielectric layer is about 25 microns.

12. The interconnect of claim 10 wherein the first thickness of the conductive layer is about 15 microns and the second thickness of the conductive layer is about 7.5 microns and the first thickness of the dielectric layer is about 50 microns and the second thickness of the dielectric layer is about 25 microns.

13. The interconnect of claim 10 wherein the dielectric and conductive layers form a section that is rectangular in shape wherein the section has a length and a width wherein the second thickness of the dielectric and conductive layers extend along a portion of the length of the section.

14. The interconnect of claim 13 wherein the second thicknesses of the dielectric and conductive layers extend along substantially the entire length of the section.

15. The head gimbal assembly of claim 10, wherein the interconnect includes first and second regions of reduced thickness, and the first region is formed by etching the layers of the interconnect by use of a resist mask pattern.

16. The head gimbal assembly of claim 15, wherein the resist mask pattern includes a mask opening small enough such that etchants etch the layers of the interconnect in a vertical direction and in a horizontal direction at a comparable rate.

17. The head gimbal assembly of claim 16, wherein the resist mask pattern includes a plurality of openings with different sizes to obtain different thicknesses of the interconnect layers.

18. The interconnect of claim 10 wherein the first thickness of the conductive layer is about 15 microns and the second thickness of the conductive layer is about 7.5 microns.

19. The head gimbal assembly of claim 10, wherein the gimbal has a first end and a second end, and the gimbal is mounted on the magnetic head at the first end and mounted on the flexure at the second end.

* * * * *